(12) United States Patent
Kim et al.

(10) Patent No.: US 9,946,828 B2
(45) Date of Patent: Apr. 17, 2018

(54) INTEGRATED CIRCUIT AND METHOD OF DESIGNING LAYOUT THEREOF

(71) Applicant: SAMSUNG ELECTRONICS CO., LTD., Suwon-si, Gyeonggi-Do (KR)

(72) Inventors: Jin-Tae Kim, Daejeon (KR); Ha-Young Kim, Seoul (KR); Jae-Woo Seo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 127 days.

(21) Appl. No.: 14/926,128

(22) Filed: Oct. 29, 2015

(65) Prior Publication Data

US 2016/0125117 A1    May 5, 2016

Related U.S. Application Data

(60) Provisional application No. 62/072,494, filed on Oct. 30, 2014.

(30) Foreign Application Priority Data

Apr. 27, 2015 (KR) .......................... 10-2015-0059103

(51) Int. Cl.
    *G06F 17/50*    (2006.01)
(52) U.S. Cl.
    CPC ...... *G06F 17/5072* (2013.01); *G06F 17/5081* (2013.01)
(58) Field of Classification Search
    CPC ............. G06F 17/5072; G06F 17/5081; G06F 17/5068; G06F 17/5077; G06F 2217/12; G03F 7/70433

USPC ...................................................... 716/50–55
See application file for complete search history.

(56) References Cited

U.S. PATENT DOCUMENTS

| | | | |
|---|---|---|---|
| 7,869,262 B2 | 1/2011 | Huang | |
| 7,989,849 B2 | 8/2011 | Sherlekar et al. | |
| 8,188,549 B2 | 5/2012 | Ishii | |
| 8,359,536 B2 * | 1/2013 | Herpel | G06F 9/4443 715/719 |
| 8,359,556 B1 | 1/2013 | Abou Ghaida et al. | |
| 8,482,083 B2 | 7/2013 | Osada et al. | |
| 8,739,095 B2 * | 5/2014 | Cao | G06F 17/50 716/111 |
| 9,158,885 B1 * | 10/2015 | Gray | G03F 7/70433 |
| 2005/0275043 A1 | 12/2005 | Huang et al. | |
| 2013/0280905 A1 | 10/2013 | Doman et al. | |

FOREIGN PATENT DOCUMENTS

| | | |
|---|---|---|
| JP | 10173055 | 6/1998 |
| JP | 2011165882 | 8/2011 |

* cited by examiner

*Primary Examiner* — Nghia Doan
(74) *Attorney, Agent, or Firm* — Volentine & Whitt, PLLC

(57) ABSTRACT

A method of designing a layout of an integrated circuit (IC), which is implemented by a computer system or a processor, includes receiving input layout data, and performing a design rule check with regard to a plurality of patterns. The method includes, merging, from among a first pattern and a second pattern against the design rule, the first pattern with a third pattern connected to a same net as the first pattern, and generating output layout data.

19 Claims, 18 Drawing Sheets

INTEGRATED CIRCUIT AND METHOD OF DESIGNING LAYOUT THEREOF

CROSS-REFERENCE TO RELATED APPLICATION

This application claims the benefit of U.S. Provisional Patent Application No. 62/072,494, filed on Oct. 30, 2014, and the benefit of Korean Patent Application No. 10-2015-0059103, filed on Apr. 27, 2015, in the Korean Intellectual Property Office, the disclosures of which are incorporated herein in its entirety by reference.

FIELD

The inventive concept relates to integrated circuits (ICs), and more particularly, to an IC and a method of designing a layout of the IC.

BACKGROUND

As semiconductor manufacturing process technology develops, the size of a transistor is decreasing, and thus, more transistors may be integrated on a semiconductor device. For example, a system-on-chip (SOC), which refers to an IC including all elements of a computer or other electronic system in one chip, has been widely used in various applications. Further, as the performance of an application is improved, a semiconductor device including more elements of the system may be needed.

Meanwhile, as the size of transistors integrated on a semiconductor device decreases, the process of manufacturing a semiconductor device has become challenging. For this, in addition to an advance in the semiconductor manufacturing process technology, a design for manufacturing (DFM) for considering a semiconductor manufacturing process in designing a semiconductor device and using an easier semiconductor manufacturing process is important.

SUMMARY

The inventive concept relates to an integrated circuit (IC) and a method of designing a layout of the IC, which provides an IC and a computer implemented method for designing a layout of the IC.

According to an aspect of the inventive concept, there is provided a computer implemented method for designing a layout of an IC including a plurality of patterns in one layer, the method including receiving input layout data including placement information regarding the plurality of patterns and coloring information in which each of the plurality of patterns has been matched to one of a plurality of masks, performing a design rule check with regard to the plurality of patterns, changing the placement information so that, with respect to a first pattern and a second pattern against the design rule from among the plurality of patterns, the first pattern is merged with a third pattern connected to a same net as the first pattern, and updating the coloring information so that the pattern formed by merging the first and third patterns is matched to a mask corresponding to the third pattern.

According to another aspect of the inventive concept, there is provided a computer implemented method for designing a layout of an IC including a plurality of patterns in one layer, the method including receiving input layout data including placement information regarding the plurality of patterns, generating coloring information in which each of the plurality of patterns is matched to one of a plurality of masks, and generating output layout data including the coloring information, wherein the generating of the coloring information includes changing the placement information so that at least two patterns connected to a same net from among the plurality of patterns are merged and generating the coloring information so that the plurality of patterns and the pattern formed by merging the at least two patterns are matched to one of the plurality of masks.

According to another aspect of the inventive concept, there is provided a computer-readable non-transitory storage medium storing a plurality of instructions for executing the computer implemented method for designing the layout of the IC.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
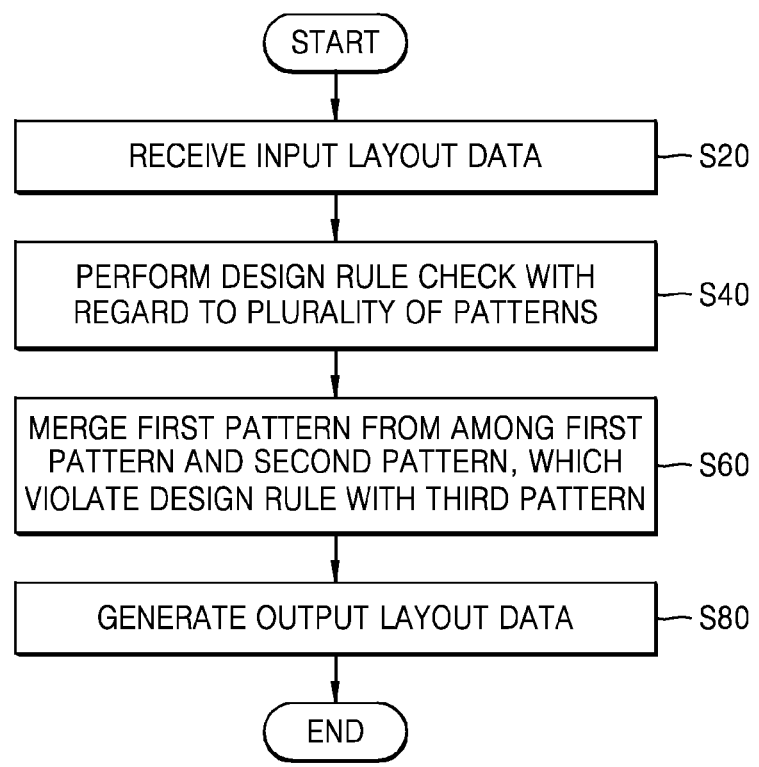
FIG. 1 is a flowchart of a method of designing a layout of an integrated circuit (IC) according to an exemplary embodiment.

Reference will now be made in detail to exemplary embodiments, examples of which are illustrated in the accompanying drawings. The present exemplary embodiments are provided so that this disclosure will be thorough and complete and will fully convey the inventive concept to those skilled in the art. As the inventive concept allows for various changes and numerous embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the accompanying drawings, like reference numerals refer to like elements throughout and the thicknesses of layers and regions and the sizes of components may be exaggerated or reduced for clarity.

The terms used in the present specification are merely used to describe exemplary embodiments and are not intended to limit the inventive concept. An expression used in the singular encompasses the expression of the plural unless it has a clearly different meaning in the context. In the present specification, it is to be understood that the terms such as "including," "having," and "comprising" are intended to indicate the existence of features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first" and "second" may be used to describe various components, such components must not be limited to the above terms. The above terms are used to distinguish one component from another. For example, a first element could be termed a second element, and, similarly, a second element could be termed a first element, without departing from the scope of exemplary embodiments.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein.

As used herein, the term "and/or" includes any and all combinations of one or more of the associated listed items.

FIG. 1 is a flowchart of a method of designing a layout of an integrated circuit (IC) according to an exemplary embodiment. The IC or the layout of the IC may include a structure in which a plurality of layers are stacked and may include a plurality of patterns in each of the layers. A pattern may refer to a shape of a material formed according to a semiconductor manufacturing process, and a plurality of patterns may be formed in one layer. For example, a pattern may be formed in a layer in order to form a via which electrically connects conductors in different layers. Also, a pattern may form a line through which an electrical signal moves in one layer. The patterns may be formed by a mask process, an etching process, and/or a deposition process.

In order to raise a degree of integration of an IC, a decrease in a size of a pattern or a distance between different patterns may be needed. Accordingly, multi-mask patterning, in which a plurality of masks are used instead of a single mask, may be used in order to form patterns included in one layer. By multi-mask patterning, each of the patterns included in one layer may correspond to one of the masks and may be formed based on the corresponding mask. For example, two patterns may be formed in one layer closer to each other when the two patterns are respectively formed based on two different masks than when the two patterns are formed based on one mask. Detailed description of multi-mask patterning will be made below with reference to FIG. 2.

Matching each of a plurality of patterns to be formed in one layer to one of a plurality of masks may be referred to as coloring the patterns, and data including corresponding relations between the patterns and the masks may be referred to as coloring information. That is, patterns having the same color may be formed based on the same mask, and patterns having different colors may be formed based on different masks. The method of designing a layout of an IC, according to an exemplary embodiment of the present disclosure, may allow effective coloring with respect to a plurality of patterns and thus make multi-mask patterning easy to use, thereby improving the degree of integration of an IC. In addition, the time taken to design a layout of an IC may be reduced.

Layouts of an IC illustrated in the accompanying drawings may be graphic data derived from layout data defining a layout of an IC. Also, elements included in a layout of an IC that are described below are defined by layout data and may be generated, removed, or modified by changing the layout data.

Referring to FIG. 1, in operation S20, input layout data may be received. The input layout data may include, for example, geometric information about a layout of an IC, such as graphic data system II (GDSII). For example, the input layout data may include placement information about a plurality of patterns in one layer, and the placement information may include information about a position of each of the patterns, a size of each of the patterns, and a net to which each of the patterns is connected. Also, in the present embodiment, the input layout data may include coloring information. The coloring information included in the input layout data may be defined by default at the time of generating a layout of an IC. Also, the coloring information may be generated by a coloring algorithm of a semiconductor design tool based on a layout of an IC.

In operation S40, a design rule check may be performed with regard to the patterns. A design rule may include a plurality of parameters that should be satisfied in a process of designing a layout of an IC based on a given semiconductor manufacturing process. For example, the design rule may include a minimum width of a pattern and/or a minimum distance between two patterns formed in one layer. Also, the design rule may include a minimum distance between patterns formed based on the same mask and a minimum distance between patterns respectively formed based on different masks according to multi-mask patterning. In the present embodiment, a plurality of patterns may be formed in the same layer, and the patterns may be checked for whether the design rule is observed.

In operation S60, from among a first pattern and a second pattern against the design rule, the first pattern may be merged with a third pattern. For example, the first and second patterns may correspond to the same mask, and a distance between the first and second patterns may be less than a minimum distance according to the design rule between patterns formed based on the same mask. The first pattern may be merged with the third pattern which is connected to the same net as the first pattern. A net corresponds to a node in a circuit diagram equivalent to a layout of an IC, and patterns connected to the same net may have the same potential (or almost the same potential due to parasitic resistance) in the time of operation of the IC.

A pattern formed by merging the first and third patterns may correspond to a mask corresponding to the third pattern. Accordingly, the design rule violated by the first and second patterns may be observed with respect to the pattern formed by merging the first and third patterns and the second pattern. The first and third patterns may be merged by removing placement information corresponding to the first and third patterns from the input layout data and generating placement information corresponding to the pattern formed by merging the first and third patterns. Also, the pattern formed by merging the first and third patterns may correspond to the mask corresponding to the third mask by updating coloring information.

When the first and second patterns go against the design rule, a mask to which the first pattern or the second pattern corresponds to may be changed in order to overcome the violation of the design rule. However, in the case that a mask corresponding to the first pattern is changed, the design rule may be violated by the first pattern and patterns adjacent to the first pattern, and changing a mask corresponding to another pattern may be repeated in order to overcome the violation of the design rule. Alternatively, a position of the first pattern or the second pattern may be changed so that the first and second patterns observe the design rule. However, if a position of the first pattern is changed, a series of movement of other patterns (for example, a pattern in the same layer as the first pattern or a pattern in a different layer from the first pattern) may occur according to movement of the first pattern, and wasted space may occur. Accordingly, the method of designing a layout of an IC, according to an exemplary embodiment of the present disclosure, may facilitate coloring, thereby reducing the time taken to design a layout of an IC. When a plurality of patterns satisfy the design rule in operation S40, operation S60 may be omitted, and operation S80 may be performed after operation S40.

In operation S80, output layout data may be generated. For example, output layout data including placement information changed in operation S60 or coloring information updated in operation S60 may be generated. As the output layout data includes not only placement information about a plurality of patterns but also coloring information, a semiconductor manufacturing process for manufacturing an IC may be built based on the output layout data.

Figure 2:
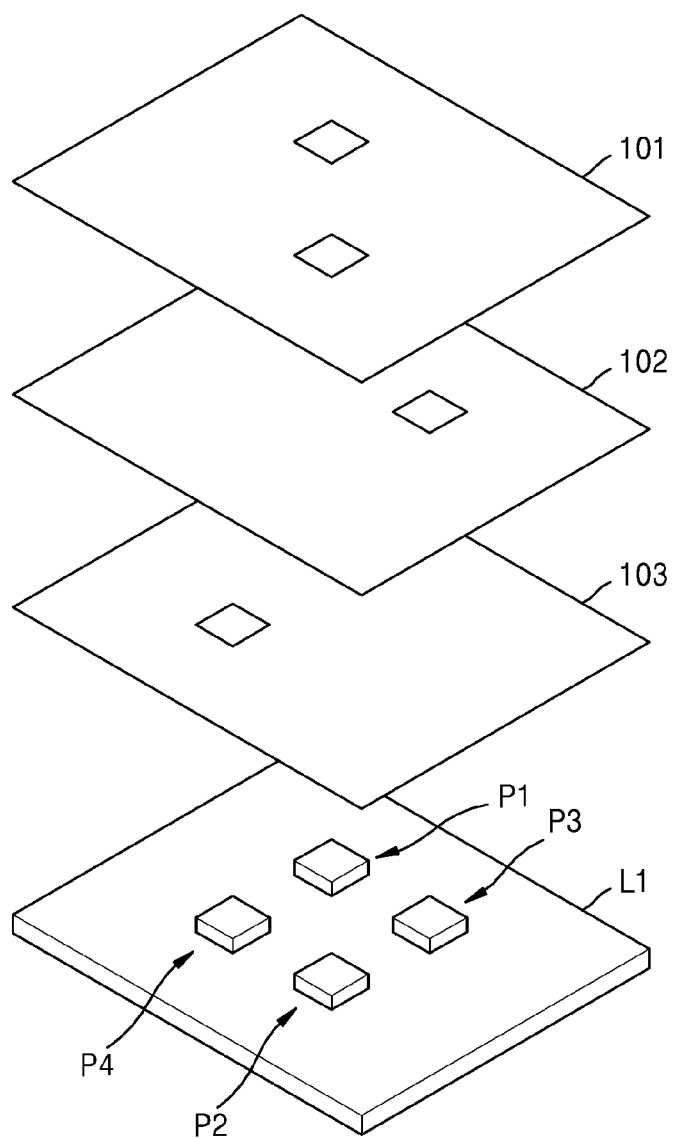
FIG. 2 is a schematic view of multi-mask patterning.

FIG. 2 is a schematic view of multi-mask patterning. As described above, a plurality of patterns formed in one layer are formed based on a plurality of masks, and thus, the degree of integration of an IC may be improved.

Referring to FIG. 2, a plurality of patterns P1 to P4 may be formed based on a plurality of masks 101 to 103. That is, each of the patterns P1 to P4 formed in a layer positioned on a first layer L1 (or included in a layer positioned on the first layer L1) may be formed based on one of the masks 101 to 103. For example, the first and second patterns P1 and P2 may be formed based on the first mask 101, the third pattern P3 may be formed based on the second mask 102, and the fourth pattern P4 may be formed based on the third mask 103.

A degree of integration of patterns formed in one layer may be improved due to multi-mask patterning. For example, as the first pattern and the third pattern are respectively formed based on different masks 101 and 102 in FIG. 2, the first and third patterns may be separated closer to each other than when the first and third patterns are formed based on the same mask. The number of masks used to form a plurality of patterns formed in one layer may be determined based on a semiconductor manufacturing process, and the time taken to manufacture an IC may be considered to determine the number of masks.

Although only the masks 101 to 103 for forming the patterns P1 to P4 are shown in FIG. 2, the patterns P1 to P4 may be formed according to additional deposition and/or etching processes. Further, although it is illustrated in FIG. 2 that the patterns P1 to P4 are prominent on the first layer L1, according to one or more exemplary embodiments, a plurality of patterns formed in one layer may be patterns forming holes or vias.

Figure 3:
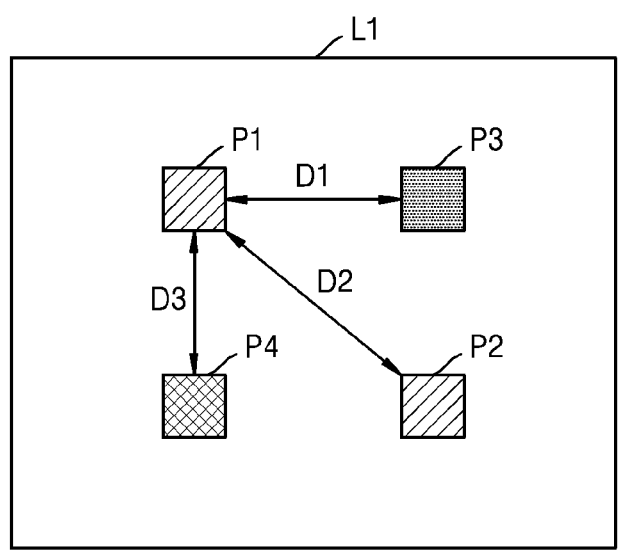
FIG. 3 is a plan view of a layout of an IC including a plurality of patterns.

FIG. 3 is a plan view of a layout of an IC including a plurality of patterns. In detail, FIG. 3 is a plan view of the patterns P1 to P4 formed based on multi-mask patterning illustrated in FIG. 2, and the patterns P1 to P4 may be formed in a layer positioned on the first layer L1.

As described above, the design rule may include D_same, which is a minimum distance between two patterns formed in one layer based on the same mask, and D_diff, which is a minimum distance between two patterns formed in one layer based on different masks. D_diff may be less than D_same due to the effect of multi-mask patterning. In a layout of an IC according to input layout data, a distance between a plurality of patterns may be equal to or greater than D_diff. A distance between patterns formed based on different masks may be a minimum distance that may be obtained from a given semiconductor manufacturing process, and thus, a distance between a plurality of patterns formed in one layer may be designed to be equal to or greater than D_diff in input layout data. A coloring operation of matching each of a plurality of patterns that are separate from each other by D_diff or more to one of a plurality of masks may be performed, and coloring information may be generated.

Referring to FIGS. 2 and 3, a distance D1 between the first pattern P1 and the third pattern P3 respectively formed based on different masks 101 and 102 may be greater than D_diff according to the design rule (That is, D1>D_diff). If D1 is less than D_diff, the first pattern P1 and the third pattern P3 may be classified as patterns against the design rule. Similarly, a distance D3 between the first pattern P1 and the fourth pattern P4 respectively formed based on different masks 101 and 103 may also be greater than D_diff according to the design rule (That is, D3>D_diff). A distance D2 between the first pattern P1 and the second pattern P2 formed based on the same mask, that is, the first mask 101, may be greater than D_same according to the design rule (That is, D2>D_same). Likewise, colored patterns going against the design rule may be referred to as a color conflict.

Figure 4:
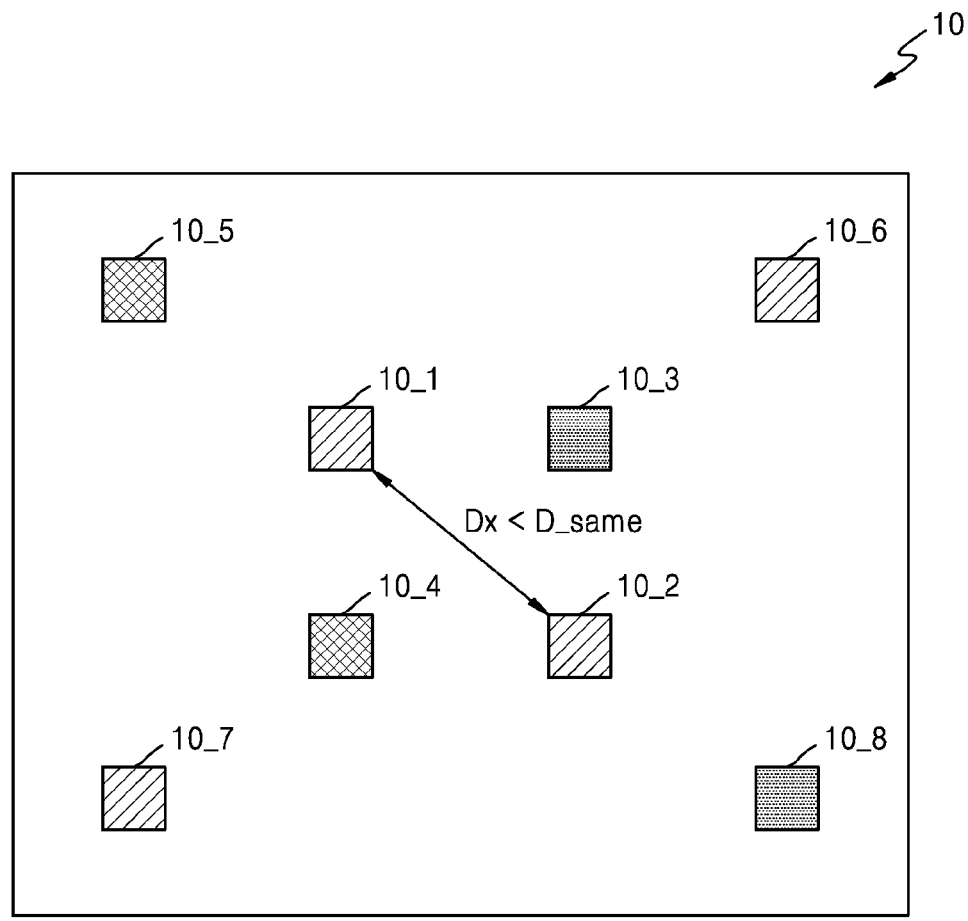
FIG. 4 is a plan view of a layout of an IC including patterns against a design rule.

FIG. 4 is a plan view of a layout 10 of an IC including patterns against the design rule. As described above, a plurality of patterns formed in one layer may correspond to one of a plurality of masks due to coloring, and coloring information may be defined by default in time of generating a layout of an IC. Alternatively, the coloring information may be generated by a coloring algorithm or process of a semiconductor design tool based on a layout of an IC. In FIG. 4, a first pattern 10_1, a second pattern 10_2, a sixth pattern 10_6, and a seventh pattern 10_7 may be formed based on a first mask, a third pattern 10_3 and an eighth pattern 10_8 may be formed based on a second mask, and a fourth pattern 10_4 and a fifth pattern 10_5 may be formed based on a third mask.

Referring to FIG. 4, the layout 10 of an IC may include a plurality of patterns 10_1 to 10_8 formed in one layer. The first pattern 10_1 and the second pattern 10_2 formed on the first mask may be separated from each other by Dx, and if Dx is less than D_same according to the design rule, the first pattern 10_1 and the second pattern 10_2 may be classified as patterns against the design rule.

In the case that the first pattern 10_1 is matched to a mask different from the first mask, for example, the second mask, in order to observe the design rule, the first pattern 10_1 and the third pattern 10_3 may go against the design rule due to D_same according to the design rule. Also, in the case that the first pattern 10_1 is matched to the third mask, the first pattern 10_1 and the fourth pattern 10_4 may go against the design rule due to D_same according to the design rule. Likewise, matching one of the patterns against the design rule to another mask may generate new patterns against the design rule.

In the case that the first pattern 10_1 is moved to be farther than D_same from the second pattern 10_2 in order to observe the design rule, a distance between the first pattern 10_1 and other patterns adjacent to the first pattern 10_1, for example, the fourth pattern 10_4 or the fifth pattern 10_5, decreases, thus going against the design rule due to D_diff according to the design rule. Likewise, moving a location of one of patterns against the design rule may generate new patterns against the design rule.

Figure 5A:
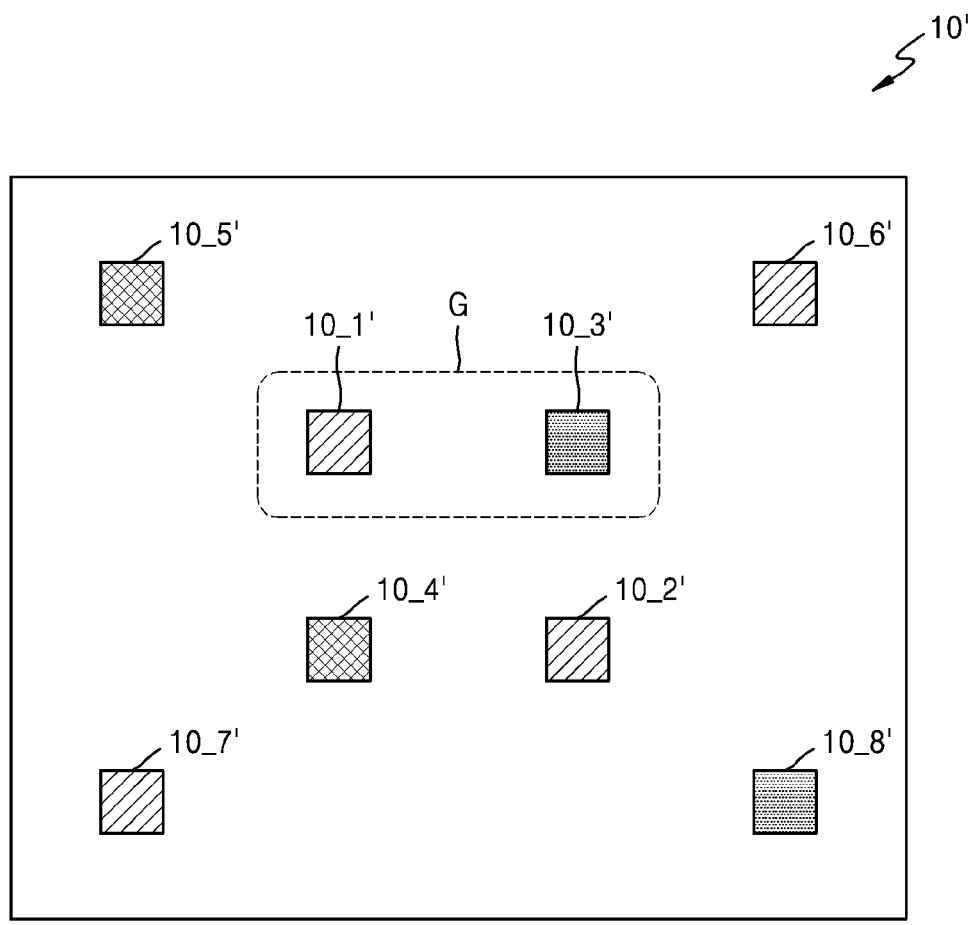
FIGS. 5A and 5B are plan views illustrating a process in which a method of designing a layout of an IC according to an exemplary embodiment is applied to a layout of an IC.
Figure 5B:
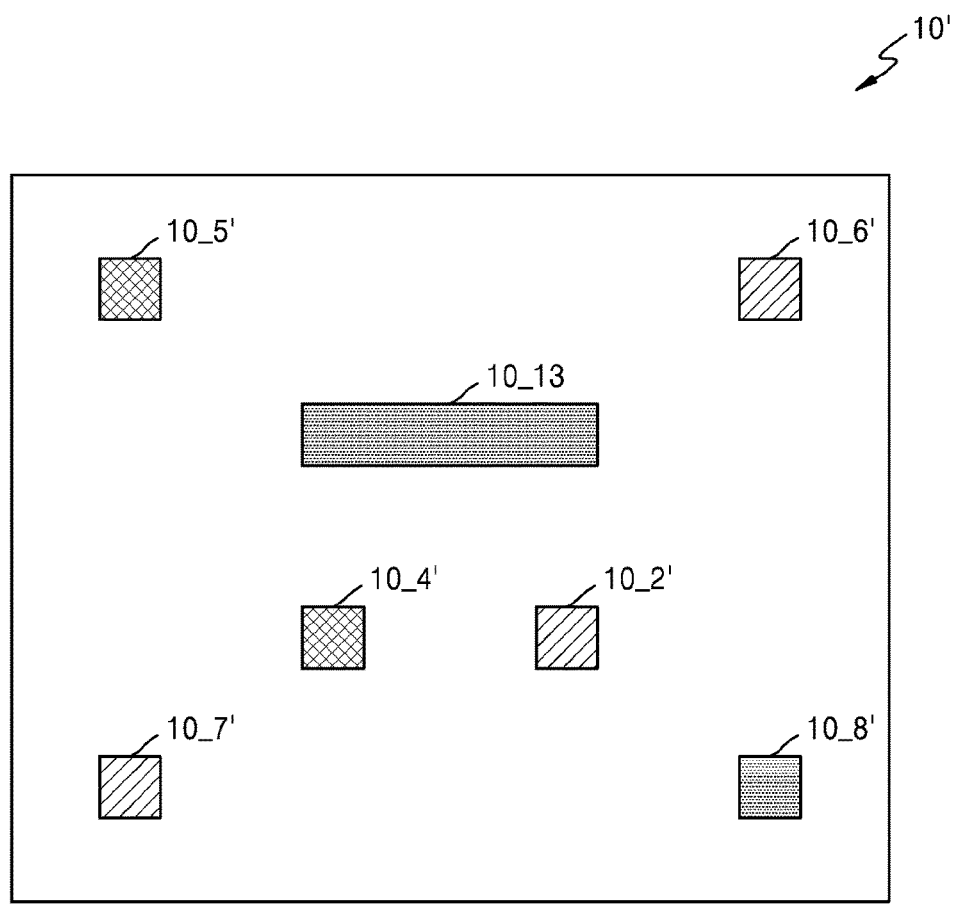

FIGS. 5A and 5B illustrate a process in which a method of designing a layout of an IC according to an exemplary embodiment is applied to a layout 10' of an IC. In detail, FIGS. 5A and 5B illustrate a process of resolving the violation of the design rule by the first and second patterns 10_1 and 10_2 against the design rule in the layout 10 of an IC of FIG. 4. In a similar way to FIG. 4, in FIGS. 5A and 5B, the layout 10' of an IC may include a plurality of patterns 10_1' to 10_8' formed in the same layer, and the first and second patterns 10_1' and 10_2' may be formed based on the same mask (that is, the first mask), and a distance between the first and second patterns 10_1' and 10_2' may be less than D_same.

According to an exemplary embodiment of the present disclosure, a pattern connected to the same net as the first pattern 10_1' or the second pattern 10_2' may be selected from among patterns adjacent to the first and second patterns 10_1' and 10_2' which are against the design rule. For example, as illustrated in FIG. 5A, in the case that the first pattern 10_1' and the third pattern 10_3' are connected to the same net, for example, a power net, the third pattern 10_3' may be selected. The first pattern 10_1' and the third pattern 10_3' connected to the same net may be grouped as illustrated as group G in FIG. 5A.

According to an exemplary embodiment of the present disclosure, the grouped patterns may be merged. That is, a plurality of patterns that have been grouped may be merged into one pattern. For example, as illustrated in FIG. 5B, the first pattern 10_1' and the third pattern 10_3' of FIG. 5A may be merged, and thus, a pattern 10_13 obtained by merging the first pattern 10_1' and the third pattern 10_3' may be generated. The merged pattern 10_13 may be formed by extending the first pattern 10_1' and/or the third pattern 10_3'. The merged pattern 10_13 may correspond to one of a plurality of masks, for example, a mask corresponding to the third pattern 10_3' (that is, the second mask), and coloring information may be updated so that the merged pattern 10_13 is matched to the mask.

Referring to FIG. 5B, the design rule may be observed due to the merged pattern 10_13 corresponding to the second mask. That is, as the merged pattern 10_13 corresponds to the second mask, a distance between the second pattern 10_2' corresponding to the first mask and the merged pattern 10_13 may be compared with D_diff according to the design rule, and the distance between the second pattern 10_2' and the merged pattern 10_13 may be greater than D_diff. Thus, a color conflict between the first pattern 10_1' and the second pattern 10_2' of FIG. 5A may be easily resolved.

Although FIGS. 5A and 5B illustrate an example in which two patterns are merged, an exemplary embodiment of the present disclosure is not limited thereto. That is, the group G of FIG. 5A may further include, as well as the first pattern 10_1' and the third pattern 10_3', other patterns connected to the same net as the first pattern 10_1', and the patterns grouped by the group G may be merged.

Figure 6:
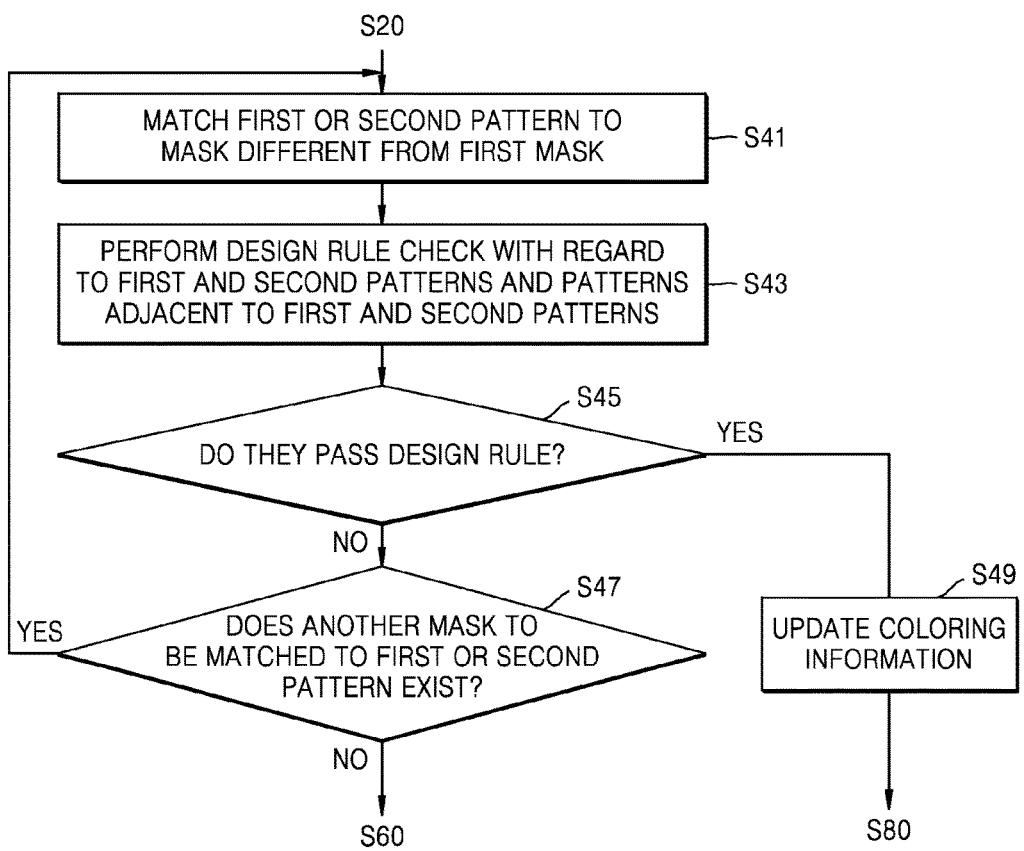
FIG. 6 is a flowchart of an example of operation S40 of FIG. 1 according to an exemplary embodiment.

FIG. 6 is a flowchart of an example of operation S40 of FIG. 1 according to an exemplary embodiment. As described above with reference to FIG. 1, in operation S40 of FIG. 1, design rule check may be performed with regard to a plurality of patterns formed in one layer. That is, whether a color conflict has occurred may be checked. Descriptions will be made with respect to FIG. 6 based on a case in which the design rule has been violated by a first pattern and a second pattern corresponding to a first mask from among the plurality of patterns in operation S40 of FIG. 1. That is, in FIG. 6, a distance between the first pattern and the second pattern may be less than D_same according to the design rule.

According to an exemplary embodiment of the present disclosure, a pattern against the design rule may be matched to another mask in operation S40 before operation S60 of FIG. 1 is performed. That is, before a third pattern connected to the same net as the first pattern is selected and the first pattern and the third pattern are merged in operation S60, whether the design rule may be observed by matching only the first pattern or the second pattern to the other mask without influence on patterns adjacent to the first and second patterns may be determined That is, if the design rule fails to be observed by matching only the first or second pattern to the other mask, the first pattern and the third pattern may be merged in operation S60. Hereinafter, the example of operation S40 of FIG. 1 will be described in detail with reference to FIG. 6.

Referring to FIG. 6, in operation S41 performed after operation S20 of FIG. 1, the first pattern or the second pattern may be matched to another mask. That is, the first or second pattern may be matched to a mask different from the first mask. In operation S43, design rule check may be performed with regard to the first and second patterns, and patterns adjacent to the first and second patterns (for example, patterns that are separate from the first and second patterns by a predetermined distance or less). As the mask corresponding to the first or second mask may be changed due to operation S41, whether the patterns adjacent to the first and second patterns and the first and second patterns observe the design rule may be determined.

In operation S45, whether the first and second patterns and the patterns adjacent to the first and second patterns pass the design rule may be determined. If the first and second patterns and the patterns adjacent to the first and second patterns pass the design rule, coloring information may be updated in operation S49. That is, the coloring information may be updated so that the mask corresponding to the first or second mask is changed. Operation S80 of FIG. 1 of generating output layout data including updated coloring information may be performed after operation S49.

If the first and second patterns and the patterns adjacent to the first and second patterns fail to pass the design rule in operation S45, whether another mask to be matched to the first or second pattern exists may be determined in operation S47. As described above, the number of masks that may be used for the plurality of patterns formed in one layer may be predetermined, and, in operation S47, whether a mask exists besides masks matched to the first or second pattern in operation S41 may be determined. If another mask to be matched to the first or second pattern exists, operation S41 may be performed after operation S47. On the contrary, if no mask to be matched to the first or second pattern exists, operation S60 of FIG. 1 of merging the first pattern with the third pattern may be performed after operation S47.

Figure 7:
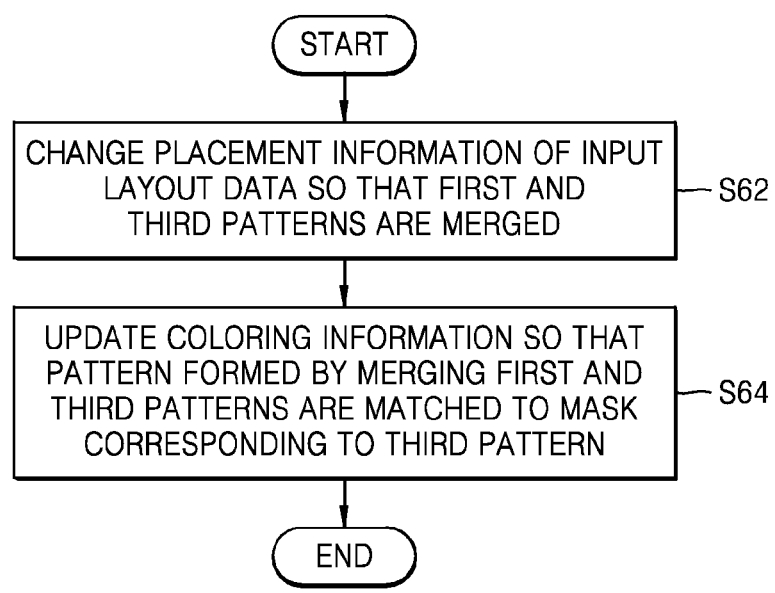
FIG. 7 is a flowchart of an example of operation S60 of FIG. 1 according to an exemplary embodiment.

FIG. 7 is a flowchart of an example of operation S60 of FIG. 1 according to an exemplary embodiment. As described above with reference to FIG. 1, in operation S60 of FIG. 1, a first pattern from among first and second patterns against the design rule may be merged with a third pattern. Descriptions will be made with respect to FIG. 7 based on a case in which the design rule has been violated by the first pattern and the second pattern corresponding to a first mask from among a plurality of patterns in operation S60 of FIG. 1.

Referring to FIG. 7, in operation S62, placement information in input layout data may be changed so that the first and third patterns are merged. The third pattern is connected to the same net as the first pattern, and the placement information included in the input layout data may be changed so that the first pattern and the third pattern are merged in operation S62. For example, placement information corresponding to the first pattern and the third pattern may be removed, and placement information corresponding to the pattern formed by merging the first pattern and the third pattern may be generated. An example of operation S62 will be described in detail with reference to FIG. 10.

In operation S64, coloring information may be updated so that the pattern formed by merging the first pattern and the third pattern corresponds to a mask corresponding to the third pattern. As the pattern formed by merging the first and third patterns corresponds to the mask corresponding to the third pattern, the design rule may be observed with respect to the pattern formed by merging the first and third patterns and the second pattern.

Figure 8:
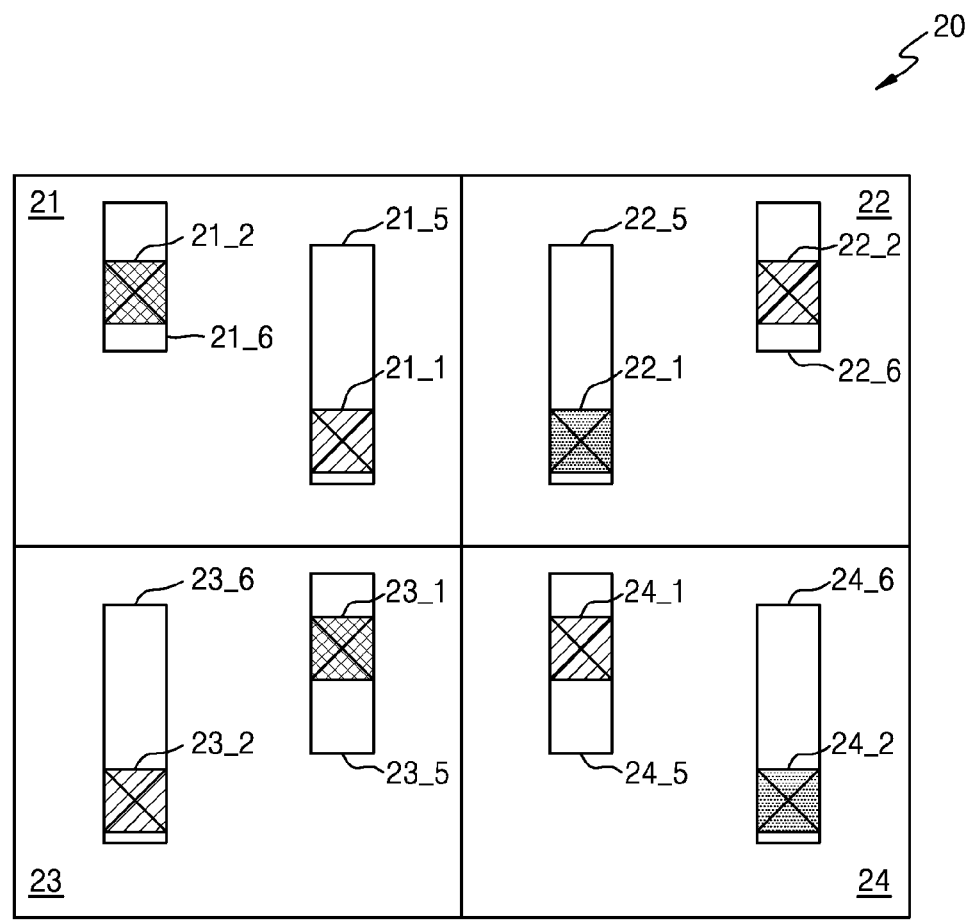
FIG. 8 is a plan view of a layout of an IC including a plurality of standard or regular cells.

FIG. 8 is a plan view of a layout 20 of an IC including a plurality of standard or regular cells 21 to 24. A standard or regular cell may refer to a unit of an IC that has a size satisfying a predetermined rule in a layout of the IC. For example, a height of a layout of the standard cell (that is, a length of a first direction perpendicular to a direction in which layers are stacked in the layout) may be constant, and a width of the standard cell (that is, a length of a second direction perpendicular to the direction in which layers are stacked in the layout and the first direction) may vary depending on the standard cell. The standard cell may include at least one input pin and/or at least one output pin, and may process an input signal received through the input pin and provide an output signal through the output pin.

An IC may be defined as a plurality of standard cells, and a tool for designing the IC may design the IC, that is, may complete a layout of the IC, by using a standard cell library including information regarding the standard cells. The tool for designing the IC may form a via in a pin included in the standard cell (that is, the input pin and the output pin), thereby connecting the pin with patterns which are formed in a different layer in which the standard cell is formed. That is, as the via is formed in the pin of the standard cell, the input signal or the output signal of the standard cell may move.

The via may be obtained by a via hole formed by a pattern and a via plug filling the via hole. In a process of designing the layout 20 of an IC, the design rule may rule a distance between vias. For example, the design rule may include a via-to-via space rule, and the via-to-via space rule may include a minimum distance between the vias. The via-to-via space rule may be determined based on processes for forming a via in a semiconductor manufacturing process, for example, a mask process, an etching process, and/or a deposition process of forming a pattern for forming the via.

By multi-mask patterning, patterns for forming each of a plurality of vias may be formed based on one of a plurality of masks. That is, each of the vias may be formed based on one of the masks. Accordingly, coloring the patterns formed in one layer may include coloring the vias. Also, as the design rule check is performed with regard to the patterns, the design rule check may be performed with regard to the vias, and there may be vias against the design rule. Hereinafter, vias going against the design rule may be understood as patterns for forming the vias going against the design rule, and coloring vias may be understood as coloring patterns for forming the vias.

Referring to FIG. 8, the layout 20 of an IC may include the plurality of standard cells 21 to 24, and the standard cells 21 to 24 may respectively include a plurality of pins 21_5 and 21_6, 22_5 and 22_6, 23_5 and 23_6, and 24_5 and 24_6 and a plurality of vias 21_1 and 212, 22_1 and 222, 23_1 and 23_2, and 24_1 and 242.

In an example illustrated in FIG. 8, the via 21_1 included in the first standard cell 21 and the via 24_1 included in the fourth standard cell 24 may go against the design rule. In detail, the via 21_1 and the via 24_1 may correspond to the same mask (that is, a first mask) and may go against a via-to-via space rule prescribing a distance between vias in the same mask. As described above, matching the via 21_1 or the via 24_1 to a mask different from the first mask in order to observe the via-to-via space rule may cause coloring other vias adjacent to the via 21_1 or the via 24_1 again. Also, moving the via 21_1 or the via 24_1 so that a distance between the via 21_1 and the via 24_1 increases in order to observe the via-to-via space rule may cause the first standard cell 21 or the fourth standard cell 24 to move or other vias adjacent to the via 21_1 or the via 24_1 to go against the via-to-via space rule. According to an exemplary embodiment of the present disclosure, as two or more vias are merged, violation of the design rule, that is, a color conflict, may be resolved, and hereinafter, this will be described in detail with reference to FIGS. 9A and 9B.

Figure 9A:
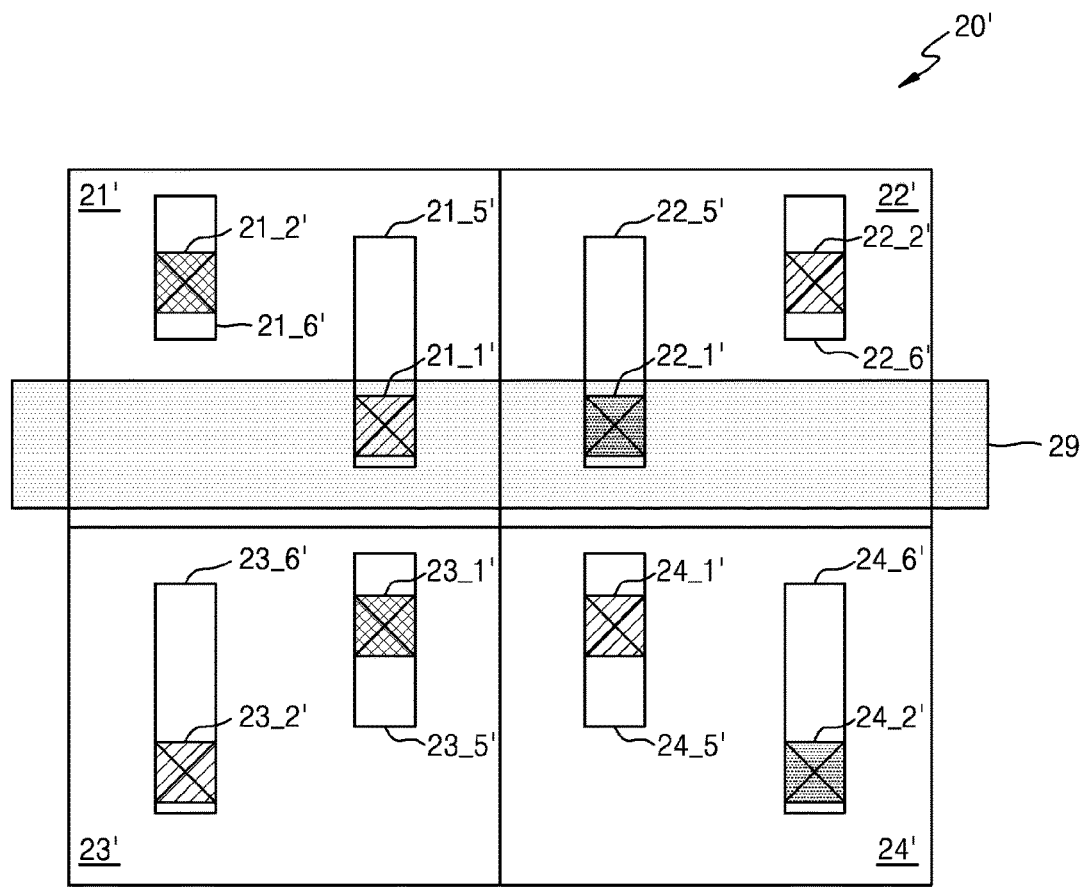
FIGS. 9A and 9B are plan views illustrating a process in which a method of designing a layout of an IC according to an exemplary embodiment is applied to a layout of an IC.
Figure 9B:
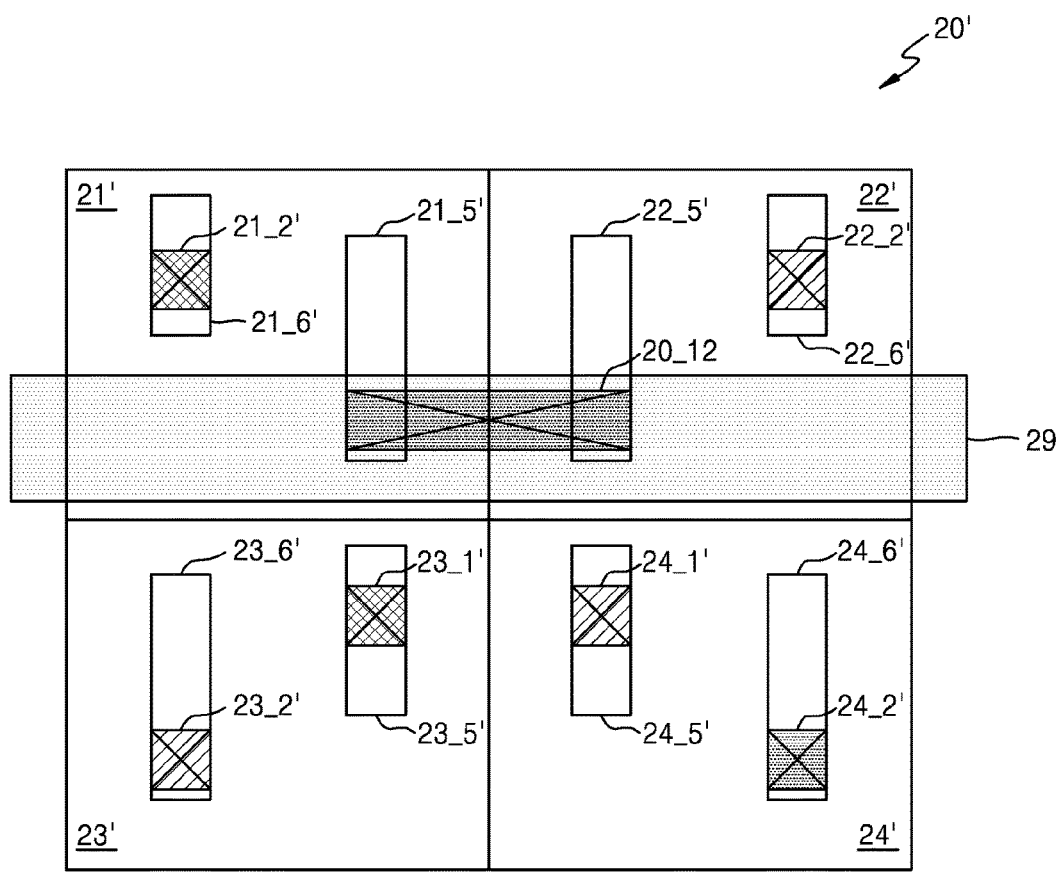

FIGS. 9A and 9B illustrate a process in which a method of designing a layout of an IC, according to an exemplary embodiment, is applied to a layout 20' of an IC. In detail, FIGS. 9A and 9B illustrate a process of resolving the violation of the design rule by the vias 21_1 and 24_1 against the design rule in the layout 20 of an IC of FIG. 8. In a similar way to FIG. 8, in FIGS. 9A and 9B, the layout 20' of an IC may include vias 21_1', 21_2', 22_1', 22_2', 23_1', 23_2', 24_1', and 24_2' connected to pins 21_5', 21_6', 22_5', 22_6', 23_5', 23_6', 24_5', and 24_6' of a plurality of standard cells 21' to 24'. The via 21_1' and the via 24_1' may correspond to the same mask (that is, a first mask) and may go against a via-to-via space rule prescribing a distance between vias corresponding to the same mask.

According to an exemplary embodiment of the present disclosure, a pattern connected to the same net as one of the vias 21_1' and 24_1' may be selected from among patterns adjacent to the vias 21_1' and 24_1' against the design rule. For example, as illustrated in FIG. 9A, the via 22_1' connected to the pin 22_5' of the second standard cell 22' may be connected to a conducting wire 29 connected to the via 21_1'. That is, the via 22_1' may be connected to the same net as the via 21_1'.

According to an exemplary embodiment of the present disclosure, the vias 21_1' and 22_1' of FIG. 9A connected to the same net may be merged. For example, as illustrated in FIG. 9B, a via 20_12 obtained by merging the vias 21_1' and 22_1' of FIG. 9A may be generated, and the merged via 20_12 may form a bar-type via. The merged via 20_12 may correspond to one of a plurality of masks, for example, a mask corresponding to the via 22_1' of FIG. 9A (that is, a second mask), and coloring information may be updated so that the merged via 20_12 is matched to the mask.

Referring to FIG. 9B, the design rule may be observed due to the merged via 20_12 that corresponds to the second mask. That is, as the merged via 20_12 corresponds to the second mask, a via-to-via space rule prescribing a distance between vias corresponding to different masks may be applied to a distance between the via 24_1' corresponding to the first mask and the merged via 20_12. Thus, the via 24_1' and the merged via 20_12 may observe the design rule.

Figure 10:
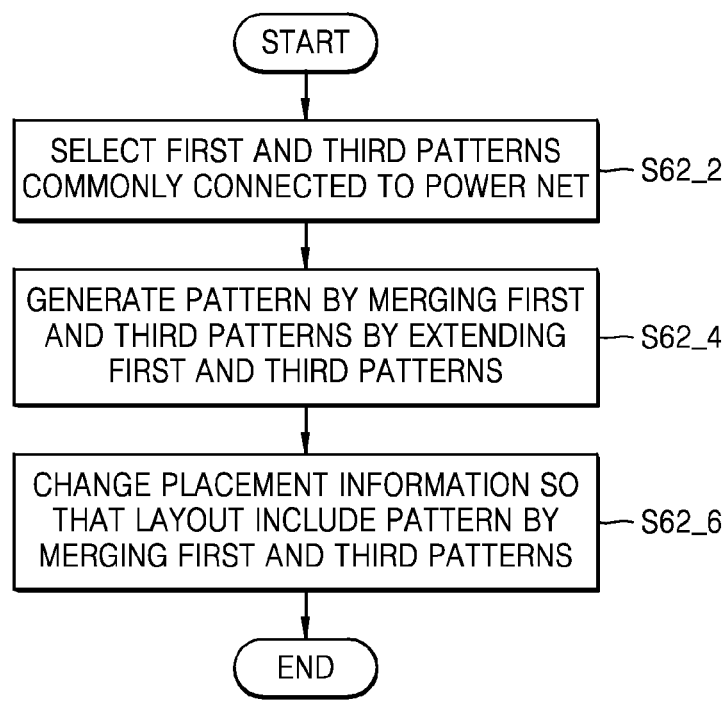
FIG. 10 is a flowchart of an example of operation S62 of FIG. 7 according to an exemplary embodiment.

FIG. 10 is a flowchart of an example of operation S62 of FIG. 7 according to an exemplary embodiment. As described above with reference to FIG. 7, in operation S62 of FIG. 7, placement information in input layout data may be changed so that first and third patterns are merged. In this regard, the first pattern may correspond to the same mask as a second pattern, and the first pattern and the second pattern may go against the design rule. Also, the third pattern may be connected to the same net as the first pattern.

Referring to FIG. 10, in operation S62_2, the first and third patterns commonly connected to a power net may be selected. The power net is a net for supplying a power voltage, for example, a positive supply voltage (VDD) or a ground voltage, to the entire IC or a portion of an IC and may be generally or locally connected to a plurality of patterns in a layout of the IC. Accordingly, in the present example, in the case that the first pattern from among the first pattern and the second pattern against the design rule is connected to the power net, the third pattern connected to the power net may be selected. For example, in the example illustrated in FIG. 9A, the net to which the conducting wire 29 and the vias 21_1' and 22_1' are connected may be a power net.

In operation S62_4, a pattern by merging the first and third patterns may be generated by extending the first and third patterns. For example, as illustrated in FIG. 9B, as the vias 21_1' and 22_1' of FIG. 9A are merged, a bar-type via may be formed. Next, in operation S62_6, placement information may be changed so that a layout of an IC includes the pattern formed by merging the first and third patterns. That is, placement information corresponding to the first pattern and the third pattern may be removed from input layout data, and placement information regarding the pattern formed by merging the first and third patterns may be added to the input layout data.

Figure 11A:
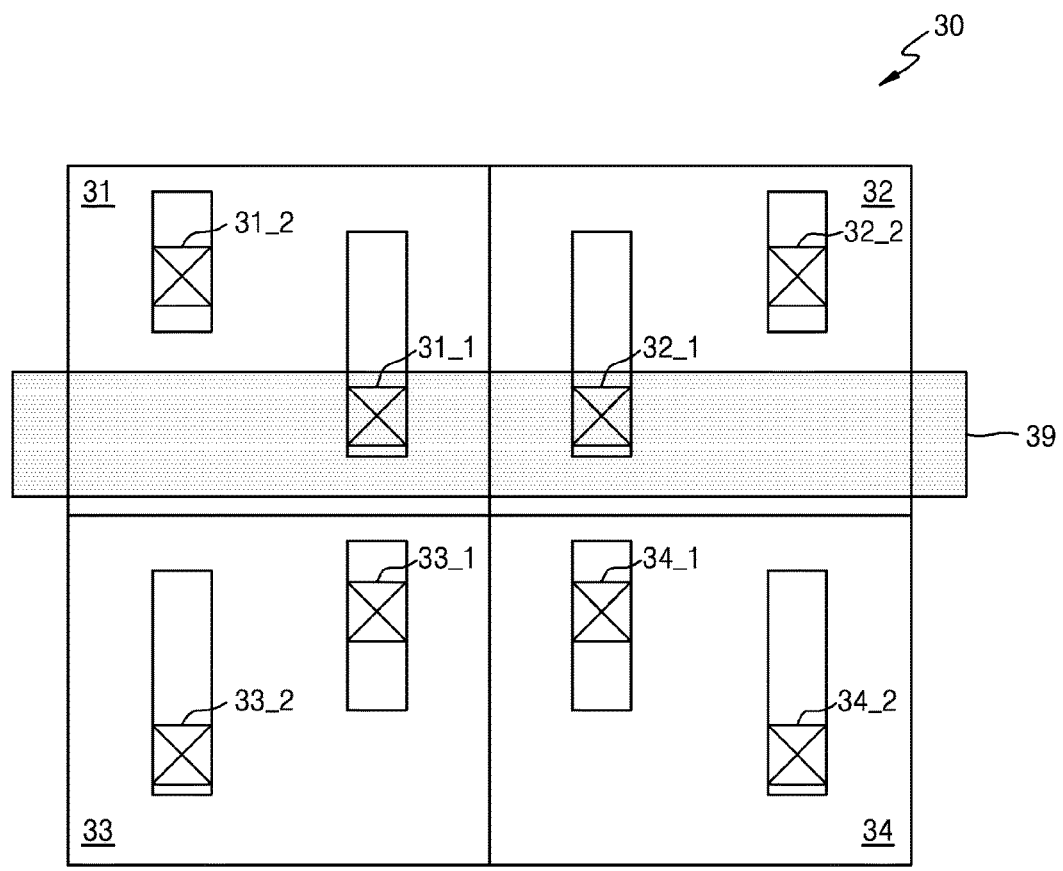
FIGS. 11A and 11B are plan views illustrating a process in which a method of designing a layout of an IC according to an exemplary embodiment is applied to a layout of an IC.
Figure 11B:
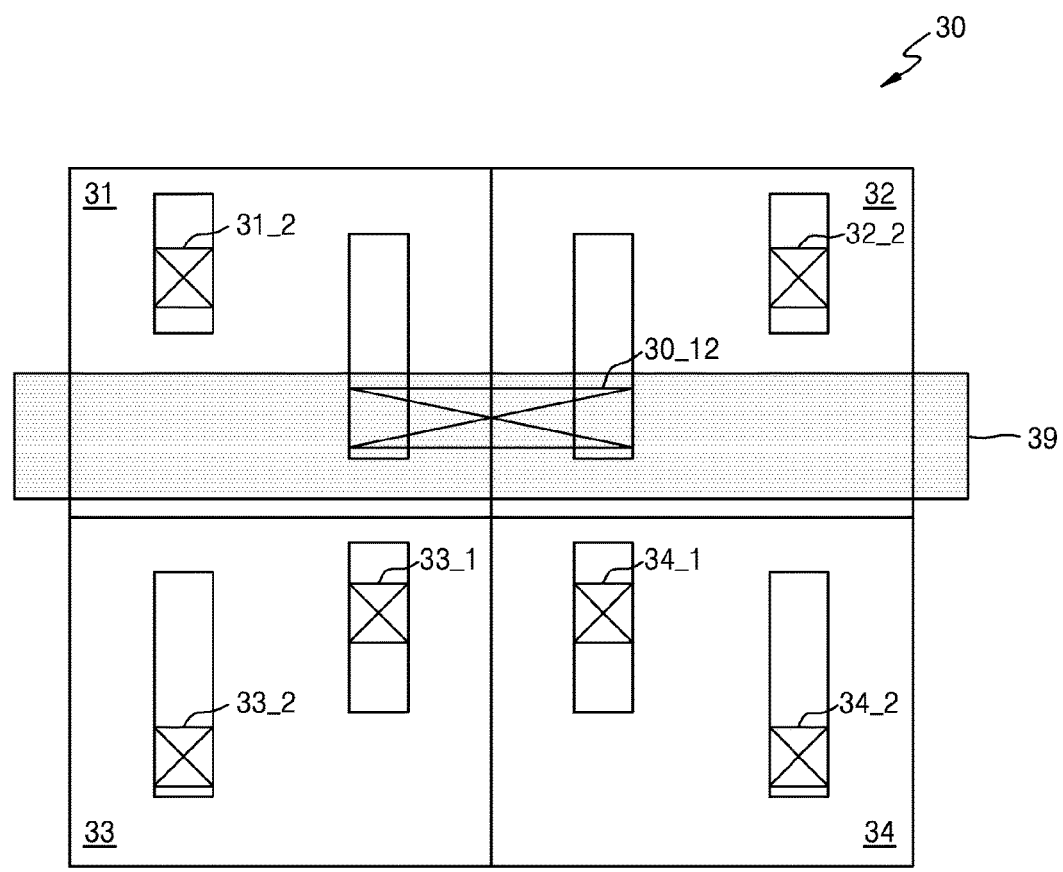

FIGS. 11A and 11B illustrate a process in which a method of designing a layout of an IC according to an exemplary embodiment is applied to a layout 30 of an IC. In detail, FIGS. 11A and 11B illustrate a method of coloring a plurality of patterns in input layout data including placement information but no coloring information. Although the method of designing a layout of an IC will be described hereinafter as coloring a plurality of vias with reference to FIGS. 11A and 11B, coloring the vias will be understood as coloring patterns for forming the vias.

According to an exemplary embodiment of the present disclosure, vias connected to the same net may be merged before a plurality of vias are colored. Accordingly, the number of vias may decrease, and coloring the vias may be easier.

Referring to FIG. 11A, the layout 30 of an IC may include a plurality of standard cells 31 to 34, and a plurality of vias 31_1, 31_2, 32_1, 32_2, 33_1, 33_2, 34_1, and 34_2 connected to pins of the standard cells 31 to 34. The vias 31_1 and 32_1 may be connected to a conducting wire 39 and thus may be connected to the same net. For example, in the case that the conducting wire 39 is a power line for supplying a power voltage to the standard cells 31 to 34, each of the standard cells 31 to 34 may be connected to the conducting wire 39 through at least one via.

Referring to FIG. 11B, as the vias 31_1 and 32_1 of FIG. 11A connected to the same net are merged, a via 30_12 obtained by merging the vias 31_1 and 32_1 of FIG. 11A may be generated. As described above, the merged via 30_12 may be a bar-type via and may be connected to the conducting wire 39. Accordingly, the number of vias to be colored in the layout 30 of an IC may decrease by one, and coloring the vias may be easier.

Figure 12:
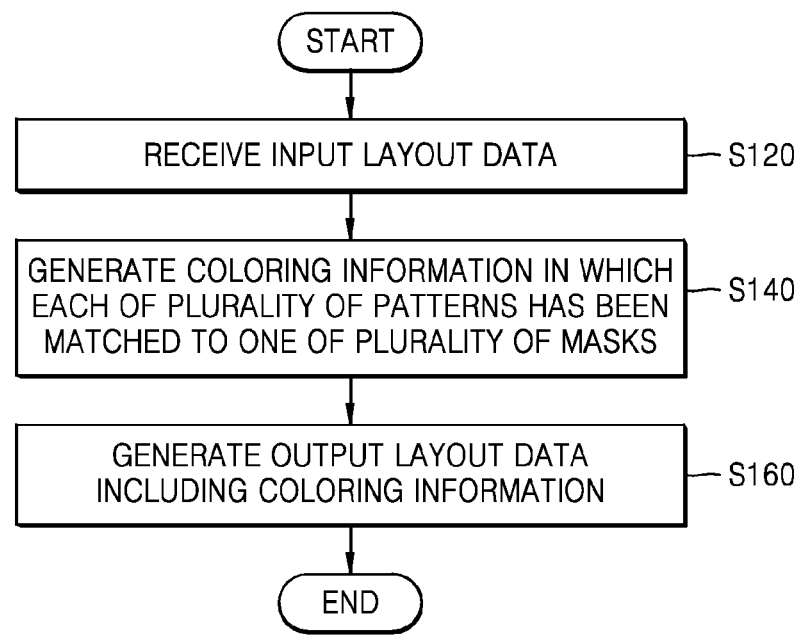
FIG. 12 is a flowchart of a method of designing a layout of an IC according to an exemplary embodiment.

FIG. 12 is a flowchart of a method of designing a layout of an IC according to an exemplary embodiment. In detail, the embodiment illustrated in FIG. 12 is a flowchart of a method of generating coloring information.

In operation S120, input layout data may be received. In the embodiment illustrated in FIG. 12, the input layout data may include placement information regarding a plurality of patterns but no coloring information regarding the patterns.

In operation S140, coloring information in which each of the patterns has been matched to one of a plurality of masks may be generated. Operation S140 will be described in detail with reference to FIG. 13. Next, in operation S160, output layout data including the coloring information generated in operation S140 may be generated.

Figure 13:
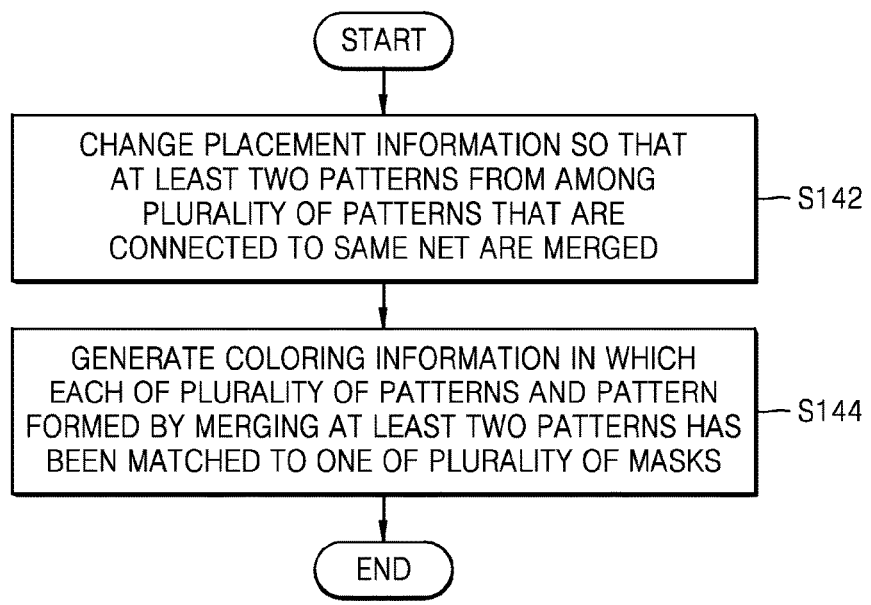
FIG. 13 is a flowchart of an example of operation S140 of FIG. 12 according to an exemplary embodiment.

FIG. 13 is a flowchart of an example of operation S140 of FIG. 12 according to an exemplary embodiment. As described above with reference to FIGS. 11A and 11B, patterns connected to the same net may be merged before a plurality of patterns are colored.

Referring to FIG. 13, in operation S142, placement information may be changed so that at least two patterns connected to the same net from among a plurality of patterns are merged. For example, based on placement information included in input layout data, pairs of patterns that are separated from each other by a predetermined distance or less may be extracted from a plurality of patterns formed in one layer, and a pair of patterns including patterns connected to the same net may be selected from among the extracted pairs of patterns, and patterns of the selected pair of patterns may be merged. The placement information in the input layout data may be changed so that a layout of an IC includes the pattern formed by merging the patterns of the selected pair of patterns. As a result, the number of patterns formed in one layer in the layout of an IC may decrease.

In operation S144, coloring information in which each of the plurality of patterns and the pattern formed by merging the patterns of the selected pair of patterns is matched to one of a plurality of masks may be generated. As coloring is performed with respect to patterns, the number of which has been decreased in operation S142, the time taken to generate the coloring information may be reduced.

Figure 14:
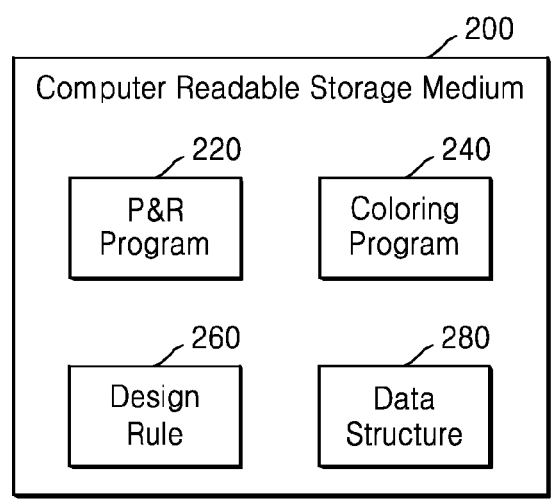
FIG. 14 is a block diagram of a computer-readable storage medium according to an exemplary embodiment.

FIG. 14 is a block diagram of a computer-readable storage medium 200 according to an exemplary embodiment. The computer-readable storage medium 200 may include an arbitrary storage medium that may be read by a computer while being used to provide commands and/or data to the computer. Examples of the computer-readable storage medium 200 may include magnetic or optical media such as disk, tape, compact disk read-only memory (CD-ROM), digital versatile disk read-only memory (DVD-ROM), compact disk recordable (CD-R), compact disk rewritable (CD-RW), digital versatile disk recordable (DVD-R) or digital versatile disk rewritable (DVD-RW), volatile or non-volatile memory such as random-access memory (RAM), read-only memory (ROM) or flash memory, non-volatile memory accessible by a universal serial bus (USB) interface, and microelectromechanical systems (MEMS). The computer-readable storage medium 200 may be inserted into a computer, integrated in a computer, or combined with a computer through communication media such as network and/or radio link. Referring to FIG. 14, the computer-readable storage medium 200 may include a placement and routing (P&R) program 220, a coloring program 240, a design rule 260, and a data structure 280.

The P&R program 220 may include a plurality of instructions placing standard cells included in a layout of an IC and connecting the standard cells through a conducting wire. Also, the P&R program 220 may include a plurality of instructions for performing a method of designing a layout of an IC according to one of the exemplary embodiments described above.

The coloring program 240 may include a plurality of instructions matching each of a plurality of patterns formed in one layer to one of a plurality of masks, in other words, coloring the patterns. Also, the coloring program 240 may include a plurality of instructions for performing a method of designing a layout of an IC according to one of the exemplary embodiments described above.

According to an exemplary embodiment of the present disclosure, the computer-readable recording medium 200 may store the P&R program 220 and the coloring program 240 including arbitrary instructions performing some or all of the operations in the flowcharts illustrated in one or more of the preceding drawings. Although the P&R program 220 and the coloring program 240 are separately illustrated in an example of FIG. 14, the P&R program 220 and the coloring program 240 may be stored as one program in the computer-readable recording medium 200.

The design rule 260 may include a plurality of parameters to be satisfied by a layout of an IC based on a semiconductor manufacturing process. The P&R program 220 and the coloring program 240 may design the layout of an IC with reference to the parameters included in the design rule 260.

The data structure 280 may include storage space for managing data generated while the P&R program 220 and the coloring program 240 are executed.

Figure 15:
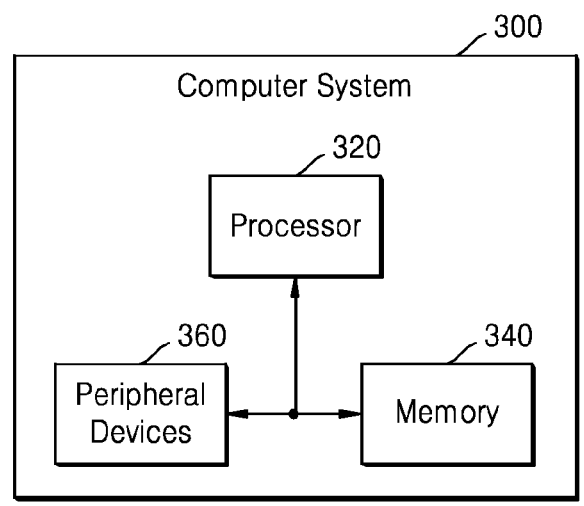
FIG. 15 is a block diagram of a computer system according to an exemplary embodiment.

FIG. 15 is a block diagram of a computer system 300 according to an exemplary embodiment. As illustrated in FIG. 15, the computer system 300 may include a processor 320, a memory 340, and various peripheral devices 360. The processor 320 may be connected to the memory 340 and the peripheral devices 360.

The processor 320 may be configured to execute instructions performing at least one of the methods according to the exemplary embodiments described above. For example, the processor 320 may perform a plurality of instructions matching each of a plurality of patterns formed in one layer included in a layout of an IC to one of a plurality of masks, that is, coloring the patterns. That is, operations S20, S40, S60, and S80 of FIG. 1 and operations S120, S140, and S160 of FIG. 12 may be performed by the processor 320.

According to an exemplary embodiment of the present disclosure, the processor 320 may execute an arbitrary set of instructions (for example, Intel Architecture-32 (IA-32), 64-bit extension IA-32, x86-64, PowerPC, Sparc, MIPS, ARM, or IA-64). In some embodiments, the computer system 300 may include one or more processor.

The processor 320 may be connected to the memory 340 and the peripheral devices 360 in an arbitrary way. For example, the processor 320 may be connected to the memory 340 and/or the peripheral devices 360 through various interconnections. Also, one or more bridge chips may be used to generate multi-connections between the processor 320, the memory 340, and the peripheral devices 360 and thus connect the elements.

The memory 340 may include a memory system of an arbitrary type. For example, the memory 340 may include volatile memory such as dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, or rambus dynamic random access memory (RDRAM) and/or non-volatile memory such as electrically erasable programmable read-only memory (EEPROM), flash memory, phase-change random access memory (PRAM), resistance random access memory (RRAM), nano floating gate memory (NFGM), polymer random access memory (PoRAM), magnetic random access memory (MRAM), or ferroelectric random access memory (FRAM). A memory controller may be included in the memory 340 for interface and/or the processor 320 may include the memory controller. The memory 340 may store instructions performing at least some of the operations in a method of designing a layout of an IC described above and data processed by the processor 320.

The memory 340 may store a layout of an IC, and may store the P&R program 220, the coloring program 240, the design rule 260, and the data structure 280. The processor 320 may perform a plurality of instructions matching each of a plurality of patterns formed in one layer included in the layout of an IC to one of a plurality of masks, that is, coloring the patterns, by using the P&R program 220, the coloring program 240, the design rule 260 and the data structure 280 stored in the memory 340. Accordingly, the computer system 300 may automatically design a layout of an IC due to the processor 320.

The peripheral devices 360 may include an arbitrary type of hardware devices that may be included in the computer system 300 or combined with the computer system 300, for example, a storage device or an input/output device (video hardware, audio hardware, user interface devices, networking hardware, or the like).

While the inventive concept has been particularly shown and described with reference to exemplary embodiments thereof, it will be understood that various changes in form and details may be made therein without departing from the spirit and scope of the following claims.

What is claimed is:

1. A method for manufacturing an integrated circuit (IC) which includes a plurality of patterns formed in a layer, the method comprising:
receiving input layout data comprising placement information regarding the plurality of patterns and coloring information in which each of the plurality of patterns has been matched to corresponding ones of a plurality of masks according to a plurality of colors;
performing a design rule check with regard to the plurality of patterns;
changing the placement information so that, with respect to a first pattern and a second pattern that violate a design rule of the design rule check, from among the plurality of patterns, the first pattern is merged with a third pattern connected to a same net as the first pattern to define a resulting pattern, the third pattern from among the plurality of patterns; and
updating the coloring information so that the resulting pattern formed by merging the first and third patterns is matched to one mask from among the plurality of masks, the one mask corresponding to the third pattern;

generating output layout data comprising the changed placement information and the updated coloring information; and manufacturing the integrated circuit based on the output layout data.

2. The method of claim 1, wherein the first and second patterns correspond to a first mask from among the plurality of masks, and the third pattern corresponds to a second mask from among the plurality of masks different from the first mask, and the updating of the coloring information comprises updating the coloring information so that the resulting pattern formed by merging the first and third patterns is matched to the second mask.

3. The method of claim 2, wherein the performing the design rule check comprises matching one of the first pattern and the second pattern to a mask different from the first mask from among the plurality of masks, and performing the design rule check with regard to patterns from among the plurality of patterns adjacent to the first and second patterns, the first pattern, and the second pattern.

4. The method of claim 1, wherein the IC comprises a plurality of regular cells each comprising at least one pin, and, in the placement information of the input layout data, the first to third patterns are respectively placed in pins comprised in different regular cells from among the plurality of regular cells.

5. The method of claim 1, wherein each of the plurality of patterns is a pattern formed in the layer to form a via, and the resulting pattern formed by merging the first and third patterns defines a pattern formed in the layer to form a bar-type via.

6. The method of claim 1, wherein the changing of the placement information comprises:

selecting the first and third patterns commonly connected to a power net of the IC and corresponding to a same mask from among the plurality of masks;

generating the resulting pattern obtained by merging the first and third patterns by extending each of the first and third patterns in the layer; and changing the placement information so that the output layout data comprises the resulting pattern formed by merging the first and third patterns.

7. The method of claim 1, wherein design rules of the design rule check comprise:

a first rule defining a distance between two patterns from among the plurality of masks corresponding to a same mask from among the plurality of masks; and a second rule defining a distance between two patterns from among the plurality of masks corresponding to different masks from among the plurality of masks, wherein the distance defined by the first rule is greater than the distance defined by the second rule.

8. A method for manufacturing an integrated circuit (IC) which includes a plurality of patterns formed in a layer, the method comprising:

receiving input layout data comprising placement information regarding the plurality of patterns;

generating coloring information in which each of the plurality of patterns is matched to corresponding ones of a plurality of masks according to a plurality of colors;

generating output layout data comprising the coloring information; and manufacturing the integrated circuit based on the output layout data, wherein the generating of the coloring information comprises changing the placement information so that at least two patterns connected to a same net from among the plurality of patterns are merged, and generating the coloring information so that the plurality of patterns and a resulting pattern formed by merging the at least two patterns are matched to one of the plurality of masks.

9. The method of claim 8, wherein the changing of the placement information comprises:

selecting a first pattern and a second pattern commonly connected to a power net of the IC from among the plurality of patterns;

generating the resulting pattern by merging the first and second patterns by extending each of the first and second patterns in the layer; and changing the placement information so that the output layout data comprises the resulting pattern formed by merging the first and second patterns.

10. The method of claim 8, wherein the at least two patterns from among the plurality of patterns are separated from each other by a predetermined distance or less.

11. The method of claim 8, wherein the generating of the coloring information further comprises performing a design rule check with regard to the plurality of patterns, and design rules of the design rule check comprise:

a first rule defining a distance between two patterns from among the plurality of patterns corresponding to a same mask from among the plurality of masks; and a second rule defining a distance between two patterns from among the plurality of patterns corresponding to different masks from among the plurality of masks.

12. The method of claim 11, wherein the distance defined by the first rule is greater than the distance defined by the second rule.

13. The method of claim 8, wherein the IC comprises a plurality of regular cells each comprising at least one pin, and, in the placement information of the input layout data, the at least two patterns are respectively placed in pins comprised in different regular cells from among the plurality of regular cells.

14. The method of claim 9, wherein each of the plurality of patterns is a pattern formed in the layer to form a via, and the resulting pattern formed by merging the at least two patterns defines a pattern formed in the layer to form a bar-type via.

15. A method for manufacturing an integrated circuit (IC) which includes a plurality of patterns formed in a layer, the method comprising:

receiving input layout data comprising placement information regarding the plurality of patterns and coloring information in which each of the plurality of patterns has been matched to corresponding ones of a plurality of masks according to a plurality of colors;

performing a design rule check with regard to the plurality of patterns to determine a first pattern and a second pattern from among the plurality of patterns that violate a design rule of the design rule check;

changing the placement information so that the first pattern is merged with a third pattern from among the plurality of patterns to define a resulting pattern;

updating the coloring information so that the resulting pattern formed by merging the first and third patterns is matched to one mask from the plurality of masks, the one mask corresponding to the third pattern;

generating output layout data comprising the changed placement information and the updated coloring information; and manufacturing the integrated circuit based on the output layout data.

16. The method of claim 15, wherein the first and second patterns correspond to a first mask from among the plurality of masks, and the third pattern corresponds to a second mask from among the plurality of masks different from the first mask, and the updating of the coloring information comprises updating the coloring information so that the resulting pattern formed by merging the first and third patterns is matched to the second mask.

17. The method of claim 16, wherein performing the design rule check comprises matching one of the first pattern and the second pattern to a mask different from the first mask from among the plurality of masks, and performing the design rule check with regard to patterns from among the plurality of patterns adjacent to the first and second patterns, the first pattern, and the second pattern.

18. The method of claim 15, wherein the changing of the placement information comprises:

selecting the first and third patterns commonly connected to a power net of the IC and corresponding to a same mask from among the plurality of masks;

generating the resulting pattern obtained by merging the first and third patterns by extending each of the first and third patterns in the layer; and changing the placement information so that the output layout data comprises the resulting pattern formed by merging the first and third patterns.

19. The method of claim 15, wherein design rules of the design rule check comprise:

a first rule defining a distance between two patterns from among the plurality of patterns corresponding to a same mask from among the plurality of masks; and a second rule defining a distance between two patterns from among the plurality of patterns corresponding to different masks from among the plurality of masks, wherein the distance defined by the first rule is greater than the distance defined by the second rule.

* * * * *